United States Patent
Park et al.

(10) Patent No.: US 7,785,964 B2
(45) Date of Patent: Aug. 31, 2010

(54) NON-VOLATILE SEMICONDUCTOR MEMORY DEVICE AND METHOD OF MANUFACTURING THE SAME

(75) Inventors: Jin-Jun Park, Seoul (KR); Hee-Jin Kwak, Suwon-si (KR); Beom-Jun Jin, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 122 days.

(21) Appl. No.: 12/078,406

(22) Filed: Mar. 31, 2008

(65) Prior Publication Data

US 2009/0008699 A1 Jan. 8, 2009

(30) Foreign Application Priority Data

Apr. 4, 2007 (KR) .................. 10-2007-0033386

(51) Int. Cl.
*H01L 21/336* (2006.01)
(52) U.S. Cl. .................. 438/263; 438/259; 438/264; 257/E21.428; 257/E21.429; 257/E21.585; 257/E21.655
(58) Field of Classification Search .............. 438/259, 438/263, 264; 257/E21.428, E21.429, E21.585, 257/E21.655
See application file for complete search history.

(56) References Cited

U.S. PATENT DOCUMENTS

| | | | |
|---|---|---|---|
| 6,878,985 B2 | 4/2005 | Arai et al. | |
| 2002/0195645 A1* | 12/2002 | Takada et al. | 257/314 |
| 2006/0187711 A1* | 8/2006 | Jang | 365/185.15 |
| 2007/0238249 A1* | 10/2007 | Swift et al. | 438/259 |

\* cited by examiner

*Primary Examiner*—Long K Tran
(74) *Attorney, Agent, or Firm*—Harness, Dickey & Pierce, P.L.C.

(57) ABSTRACT

Example embodiments relate to a non-volatile semiconductor memory device and a method of manufacturing the same. A semiconductor device includes an isolation layer protruding from a substrate, a spacer, a tunnel insulation layer, a floating gate, a dielectric layer pattern and a control gate. The spacer may be formed on a sidewall of a protruding portion of the isolation layer. The tunnel insulation layer may be formed on the substrate between adjacent isolation layers. The floating gate may be formed on the tunnel insulation layer. The floating gate contacts the spacer and has a width that gradually increases from a lower portion toward an upper portion. The dielectric layer pattern and the control gate may be sequentially formed on the floating gate.

13 Claims, 7 Drawing Sheets

SECOND DIRECTION  FIRST DIRECTION

NON-VOLATILE SEMICONDUCTOR MEMORY DEVICE AND METHOD OF MANUFACTURING THE SAME

PRIORITY STATEMENT

This application claims the benefit of priority under 35 U.S.C. §119 from Korean Patent Application No. 2007-0033386, filed on Apr. 4, 2007, the contents of which are herein incorporated by reference in their entireties.

BACKGROUND

1. Field

Example embodiments relate to a semiconductor device and a method of manufacturing the same. Other example embodiments relate to a non-volatile semiconductor flash memory device and a method of manufacturing the same.

2. Description of the Related Art

Semiconductor memory devices are generally categorized as volatile memory devices, which lose data over time (e.g., a dynamic random access memory (DRAM) device or a static random access memory (SRAM) device), or non-volatile memory devices, which continuously keep stored data over time (e.g., an electrically erasable programmable read only memory (EEPROM) device capable of inputting/outputting data or a flash memory device advanced from the EEPROM device). The non-volatile memory device generally used in various electronic apparatuses is the flash memory device. The flash memory device may electrically control inputting and outputting of data utilizing Fowler-Nordheim (F-N) tunneling mechanism or channel hot electron injection mechanism.

The flash memory devices may be classified according to structure as a NAND type flash memory device and a NOR type flash memory device. The NAND type flash memory device may include N numbers of unit cell transistors. The cell transistors may be electrically connected to one another in serial to form unit strings of the NAND type flash memory device. The unit strings of the NAND type flash memory device may be electrically connected to a bit line and a ground line in parallel. The NOR type flash memory device may include a plurality of cell transistors. Each of the cell transistors in the NOR type flash memory device may be electrically connected to a bit line and a ground line sequentially (or in parallel). The NOR type flash memory device may have a faster response speed. The NAND type flash memory device may have a higher integration degree.

A programming operation and an erasing operation of the NAND type flash memory device may be performed in a relatively short time. The programming and the erasing operations may be performed with low voltages. As such, a unit cell of the NAND type flash memory device may have a higher coupling ratio.

To increase the coupling ratio of the unit cell, a high capacitance may be established (or ensured) between a floating gate and a control gate. A low capacitance may be necessary between the floating gate and a substrate.

A dielectric layer interposed between the floating gate and the control gate may have a multi-layer structure that includes a lower silicon oxide film, a silicon nitride film and an upper silicon oxide film. The dielectric layer may be formed on a lateral portion of the floating gate to increase an effective area of the unit cell. Hence, the capacitance between the floating gate and the control gate may increase due to the dielectric layer.

To form the dielectric layer on the lateral portion of the floating gate, a desired distance may be provided between adjacent floating gates. When the distance between adjacent floating gates increases, a size of the unit cell may increase, deteriorating the integration degree of the nonvolatile memory device. When the distance between adjacent floating gates decreases, voids may be generated (or formed) in the control gate formed between adjacent floating gates. That is, the control gate formed between adjacent floating gates may have defects.

In order to increase the integration degree of the memory device, a line width of the floating gate may be decreased and/or a height of the floating gate may be increased. Therefore, fabricating processes for the floating gate may be complicated. Failures relating to the floating gate may occur due to complicated processes used to form the floating gate.

SUMMARY

Example embodiments relate to a semiconductor device and a method of manufacturing the same. Other example embodiments relate to a non-volatile semiconductor flash memory device and a method of manufacturing the same.

Example embodiments provide a semiconductor device having a higher integration degree and an increased coupling ratio and a method of manufacturing the same.

According to example embodiments, there is provided a semiconductor device including an isolation layer, a spacer, a tunnel insulation layer, a floating gate, a dielectric layer pattern and a control gate. The isolation layer may protrude from a substrate. The spacer may be formed on a sidewall of a protruding portion of the isolation layer. The tunnel insulation layer may be formed on the substrate between adjacent isolation layers. The floating gate may be formed on the tunnel insulation layer. The floating gate contacts the spacer. The floating gate has a width that gradually increases from a lower portion of the floating gate towards an upper portion of the floating gate. The dielectric layer pattern may be formed on the floating gate. The control gate may be formed on the dielectric layer pattern.

In example embodiments, the floating gate may protrude a first distance from the substrate and the isolation layer may protrude a second distance from the substrate such that the second distance is greater than the first distance. Alternatively, a height of the floating gate may be substantially the same as a height of the protruding portion of the isolation layer.

In example embodiments, a width of the spacer may gradually decrease from the substrate towards an upper surface of the isolation layer. The spacer may include silicon nitride or silicon oxynitride.

In example embodiments, the dielectric layer pattern may include a material having a dielectric constant substantially larger than a dielectric constant of silicon oxide. For example, the dielectric layer pattern may include hafnium oxide, tantalum oxide, zirconium oxide, aluminum oxide, yttrium oxide, vanadium oxide, hafnium aluminate, hafnium silicate and combinations thereof.

In example embodiments, the isolation layer may extend along a first direction whereas the control gate may extend in a second direction substantially perpendicular to the first direction. For example, the isolation layer and the control gate may each have line shapes.

In example embodiments, adjacent floating gates may be separated by the isolation layer.

According to example embodiments, there is provided a method of manufacturing a semiconductor device. In the method of manufacturing the semiconductor device, an isolation layer may protrude from a substrate. A spacer may be formed on a sidewall of a protruding portion of the isolation layer. A tunnel insulation layer may be formed on the substrate between adjacent isolation layers. A preliminary floating gate may be formed on the tunnel insulation layer. The preliminary floating gate may have a width that gradually increases from a lower portion of the preliminary floating gate towards an upper portion of the preliminary floating gate. A floating gate may be formed on the tunnel insulation layer by partially etching the preliminary floating gate. Adjacent floating gates may be separated from each other by the isolation layer. A dielectric layer pattern may be formed on the isolation layer and the floating gate. A control gate may be formed on the dielectric layer pattern.

In formation of the isolation layer according to example embodiments, a mask may be formed on the substrate. A trench may be formed by partially etching the substrate using the mask. An oxide layer may be formed on the mask to fill up the trench. The oxide layer may be partially removed until the mask is exposed. The mask may be removed from the substrate.

In example embodiments, the isolation layer may have a line shape extending along a first direction. The control gate may have a line shape extending along a second direction substantially perpendicular to the first direction.

In example embodiments, a height of the protruding portion of the isolation layer may be substantially larger than a height of the floating gate.

Forming the spacer may include forming an insulation layer on the isolation layer and the substrate. The insulation layer may be anisotropically etched until the substrate is exposed. The insulation layer may be formed using silicon nitride or silicon oxynitride.

In formation of the preliminary floating gate according to example embodiments, a conductive layer may be formed on the tunnel insulation layer to fill up an opening between adjacent isolation layers. The conductive layer may be partially removed until the isolation layer is exposed.

In example embodiments, the dielectric layer may be formed using a material that has a dielectric constant substantially higher than a dielectric constant of silicon oxide. For example, the dielectric layer may be formed using hafnium oxide, tantalum oxide, zirconium oxide, aluminum oxide, yttrium oxide, vanadium oxide, hafnium aluminate, hafnium silicate and combinations thereof.

According to example embodiments, the dielectric layer pattern having the higher dielectric constant is not interposed between adjacent floating gates such that interference between adjacent floating gates may be more effectively prevented (or reduced). Hence, the semiconductor device may have increased electrical characteristics. The floating gate may have the upper portion substantially wider than the lower portion thereof such that a capacitance between the floating gate and the tunnel insulation layer may decrease whereas a capacitance between the floating gate and the dielectric layer pattern may increase. Therefore, the semiconductor device may have an increased coupling ratio while more effectively reducing (or preventing) interference between adjacent floating gates. Moreover, because the floating gate may be formed by a self-alignment process using the spacer without a photolithography process, failures relating to the floating gate caused during the photolithography process may be more efficiently prevented (or reduced).

BRIEF DESCRIPTION OF THE DRAWINGS

Example embodiments will be more clearly understood from the following detailed description taken in conjunction with the accompanying drawings.

FIG. 1 is a perspective view illustrating a semiconductor device in accordance with example embodiments;

FIG. 2 is a cross-sectional view illustrating a semiconductor device in accordance with example embodiments; and FIGS. 3 to 13 are cross-sectional views illustrating a method of manufacturing a semiconductor device in accordance with example embodiments.

DESCRIPTION OF EXAMPLE EMBODIMENTS

Figure 1:
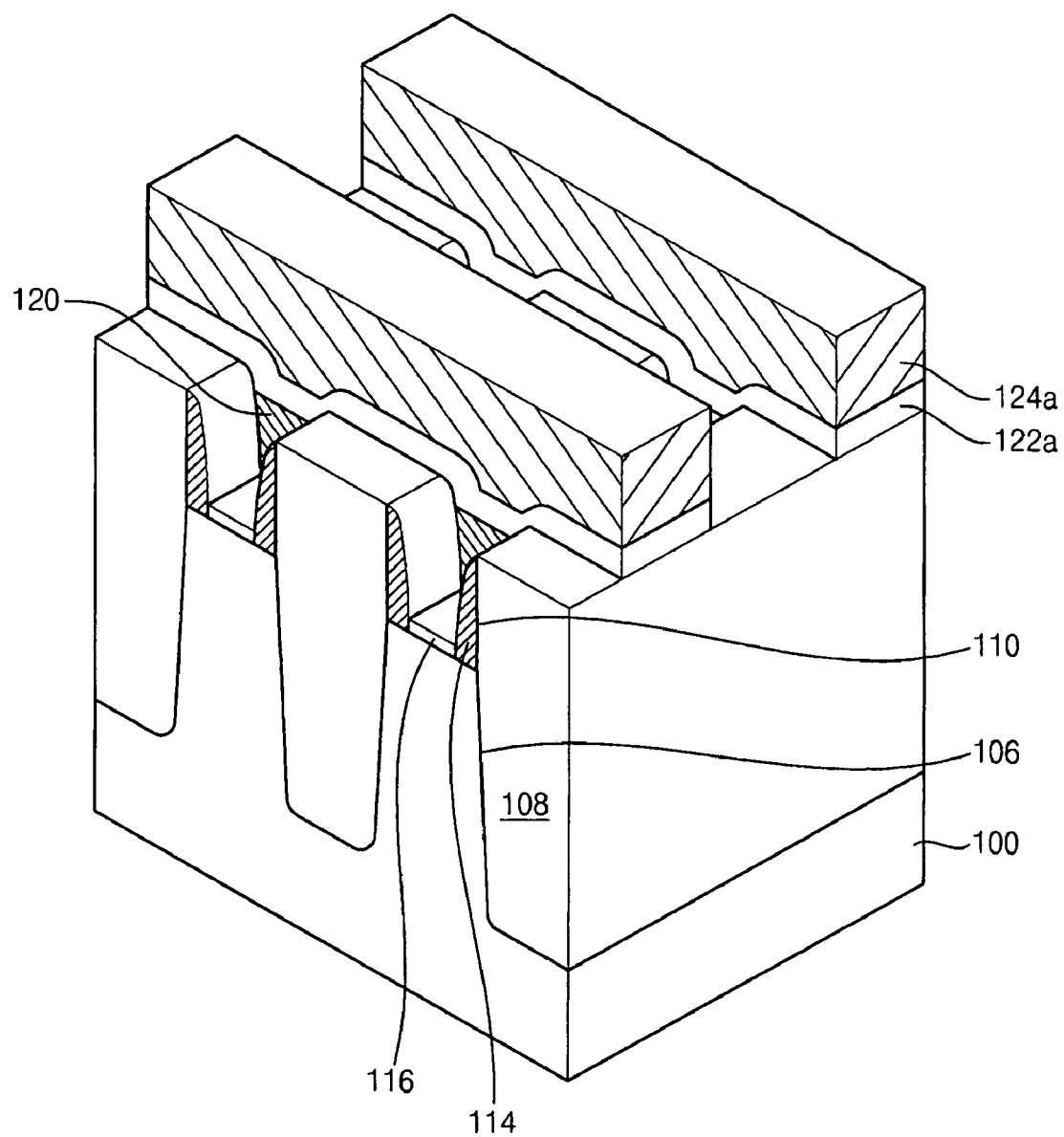
FIGS. 1-13 represent non-limiting, example embodiments as described herein.

Various example embodiments will now be described more fully with reference to the accompanying drawings in which some example embodiments are shown. In the drawings, the thicknesses of layers and regions may be exaggerated for clarity.

Detailed illustrative embodiments are disclosed herein. However, specific structural and functional details disclosed herein are merely representative for purposes of describing example embodiments. This invention, however, may be embodied in many alternate forms and should not be construed as limited to only example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the scope of example embodiments.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the Figures. For example, if the device in the figures is turned over, elements described as "below" or "beneath" other elements or features would then be oriented "above" the other elements or features. Thus, for example, the term "below" can encompass both an orientation that is above as well as below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

In order to more specifically describe example embodiments, various aspects will be described in detail with reference to the attached drawings. However, the present invention is not limited to example embodiments described.

Example embodiments relate to a semiconductor device and a method of manufacturing the same. Other example embodiments relate to a non-volatile semiconductor flash memory device and a method of manufacturing the same.

Figure 2:
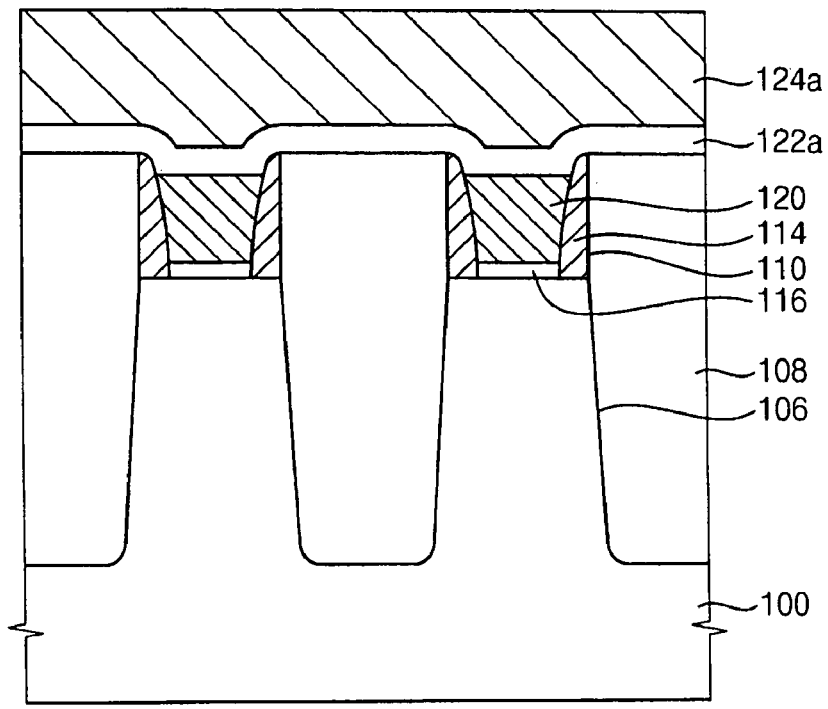

FIG. 1 is a perspective view illustrating a semiconductor device in accordance with example embodiments. FIG. 2 is a cross-sectional view illustrating the semiconductor device according to example embodiments.

Although FIGS. 1 and 2 illustrate a NAND type flash memory device, example embodiments may be used in other non-volatile semiconductor devices (e.g., a NOR type flash memory device) or volatile semiconductor devices (e.g., a DRAM device, an SRAM device or the like).

Referring to FIGS. 1 and 2, the semiconductor device provided on a substrate includes a tunnel insulation layer 116, a spacer 114, a floating gate 120, a dielectric layer pattern 122a and a control gate 124a.

The substrate 100 may include a semiconductor substrate (e.g., silicon substrate, a germanium substrate, a silicon-germanium substrate or the like). Alternatively, the substrate 100 may include a silicon-on-insulator (SOI) substrate or a germanium-on-insulator (GOI) substrate.

The substrate 100 may have (or be divided into) an active region and a field region by forming an isolation layer 108 on the substrate 100. That is, the isolation layer 108 may define the active and the field regions of the substrate 100. The isolation layer 108 may be positioned in a trench 106 formed at an upper portion of the substrate 100. In example embodiments, the active and the field regions may be disposed (or formed) substantially parallel (or sequentially) to each other. The substrate 100 may have a plurality of active and field regions alternatively disposed. Each of the active and the field regions may extend along a first direction on the substrate 100.

The isolation layer 108 may include an oxide (e.g., silicon oxide). In example embodiments, adjacent isolation layers 108 may be positioned substantially parallel (or sequentially) to each other. A plurality of isolation layers 108 may be provided on the substrate 100. Each of the isolation layers 108 may extend along the first direction.

In example embodiments, an inner oxide layer may be disposed (formed) between the trench 106 and the isolation layer 108. The inner oxide layer may include silicon oxide formed by a thermal oxidation process when the substrate 100 includes silicon.

In example embodiments, the isolation layer 108 may have a protruding portion substantially higher than an upper surface of the substrate 100. That is, the isolation layer 108 may protrude from the upper surface of the substrate 100 by a desired height. The isolation layer 108 may have a flat upper surface through a planarization process (e.g., a chemical mechanical polishing (CMP) process and/or an etch-back process). Because the isolation layer 108 has the protruding portion, an opening 110 may be provided between adjacent isolation layers 108. The opening 110 partially exposes the substrate 100.

In example embodiments, a pair of spacers 114 may be formed on both sidewalls of the opening 110. That is, each of the spacers 114 may be disposed (or formed) on a sidewall of the protruding portion of the isolation layer 108. The spacer 114 includes a lower portion substantially wider than an upper portion thereof. A width of the lower portion of the spacer 114 adjacent to the substrate 110 may be greater than that of the upper portion of the spacer 114 adjacent to an upper surface of the isolation layer 108.

In the above-described structure, the opening 110 between adjacent isolation layers 108 includes a lower portion substantially wider than an upper portion of the opening 110. With the spacers 114, the upper portion of the opening 110 adjacent to the upper surface of the isolation layer 108 may have a width substantially greater than that of the lower portion of the opening 110 adjacent to the substrate 100.

The spacers 114 may include a material having a higher etching selectivity with respect to the isolation layer 108 and the substrate 100. For example, the spacer 114 may include a nitride (e.g., silicon nitride) or an oxynitride (e.g., silicon oxynitride).

The tunnel insulation layer 116 may be provided on a portion of the substrate 110 exposed through the opening 110. For example, the tunnel insulation layer 116 may include an oxide (e.g., silicon oxide) formed by a thermal oxidation process or a chemical vapor deposition (CVD) process.

In example embodiments, capacitances at both lateral portions of the tunnel insulation layer 116 may decrease because the tunnel insulation layer 116 has a width substantially smaller than that of the active region defined by the isolation layer 108. Thus, to the semiconductor memory device may have an increased coupling ratio.

The floating gate 120 may be formed (or disposed) on the tunnel insulation layer pattern 116. The floating gate 120 may contact a sidewall of the spacer 114. When two spacers 114 are provided between adjacent isolation layers 108, the floating gate 120 may contact both sidewalls of the spacers 114.

In example embodiments, a width of the floating gate 120 may gradually increase from a lower portion towards an upper portion of the floating gate 120. For example, the floating gate 120 may have a cross-section of a reversed trapezoid shape. Because the upper portion of the opening 110 formed between adjacent spacers 114 has the width substantially wider than that of the lower portion thereof, the floating gate 120 may have the upper portion having the width substantially wider than that of the lower portion thereof. The upper portion of the floating gate 102a may have the width substantially greater than a width of the tunnel insulation layer 108.

In example embodiments, the floating gate 120 may partially fill up the opening 110. Alternatively, the floating gate 120 may be formed on the tunnel insulation layer 116 to completely fill up the opening 110. Hence, a height of the isolation layer 108 may be substantially the same as, or substantially greater, than that of the floating gate 120.

In example embodiments, the floating gate 120 may have an isolated pattern structure. A plurality of floating gates 120 may be arranged on the substrate 100 by a desired distance. The floating gate 120 may include doped polysilicon, metal and/or metal compound.

In one example embodiment, an upper surface of the floating gate 120 may be positioned on a plane substantially the same as that of the upper surface of the isolation layer 108. In another example embodiment, the upper surface of the floating gate 120 may be substantially lower than that of the upper surface of the isolation layer 108. The floating gate 120 may protrude a first distance from the substrate 100 and the isolation layer 108 may protrude a second distance from the substrate 100 such that the second distance is greater than the first distance.

Referring now to FIGS. 1 and 2, the dielectric layer pattern 122a may be disposed on the floating gate 120 and the isolation layer 108. The dielectric layer pattern 122a may extend along a second direction substantially perpendicular to the first direction. The dielectric layer pattern 122a may have a line shape.

As the floating gate 120 becomes gradually wider from the lower portion towards the upper portion, an area of the upper surface of the floating gate 120 may be substantially greater than that of a lower surface thereof. Thus, a contact area between the floating gate 120 and the dielectric layer pattern 122a may increase.

In example embodiments, the dielectric layer pattern 122a may include a material having a dielectric constant substantially higher than that of silicon oxide. For example, the dielectric layer pattern 122a may include a metal oxide (e.g., hafnium oxide ($HfO_x$), tantalum oxide ($TaO_x$), zirconium oxide ($ZrO_x$), aluminum oxide ($AlO_x$), yttrium oxide ($YO_x$), vanadium oxide ($VO_x$) and combinations thereof). Alternatively, the dielectric layer pattern 122a may include a metal compound (e.g., hafnium aluminate ($HfAl_x$), hafnium silicate ($HfSi_x$), titanium silicate ($TiSi_x$) and combinations thereof).

To reduce a leakage current from the dielectric layer pattern 122a, the dielectric layer pattern 122a may have a multi-layered structure that includes a silicon oxide film and a high-dielectric compound film. Alternatively, the dielectric layer pattern 122a may include a lower silicon oxide film, a high-dielectric compound film and an upper silicon oxide film.

As the dielectric constant of the dielectric layer pattern 122a and the contact area between the floating gate 120 and the dielectric layer pattern 122a increases, a capacitance of the dielectric layer pattern 122a may increase.

When the floating gate 120 is substantially lower than the isolation layer 108, adjacent floating gates 120 may be separated from each other. That is, the dielectric layer pattern 122a may be directly formed on a portion of the isolation layer 108 between adjacent floating gates 120. In a semiconductor memory device according to example embodiments, interference between adjacent floating gates may frequently occur when a layer having a higher dielectric constant is positioned between adjacent floating gates. According to example embodiments, interference between adjacent floating gates 120 may be more effectively prevented because adjacent floating gates 120 are separated by the isolation layer 108 without interposing the dielectric layer pattern 122a therebetween.

The control gate 124a may be disposed on the dielectric layer pattern 122a. The control gate 124a may extend over the substrate 100 along the second direction. The control gate 124a may have a line shape.

In example embodiments, the control gate 124a may include a conductive material (e.g., doped polysilicon, metal, metal compound or the like). The control gate 124a may have a single layer structure or a multi-layer structure.

FIGS. 3 to 13 are diagrams illustrating cross-sectional views of a method of manufacturing a semiconductor device in accordance with example embodiments.

Although FIGS. 3 to 13 illustrate a method of manufacturing a non-volatile memory device (e.g., a NAND type flash memory device, example embodiments may be used in manufacturing processes for other non-volatile semiconductor devices (e.g., a NOR type flash memory device) or volatile memory devices (e.g., a DRAM device, an SRAM device or the like).

Figure 3:
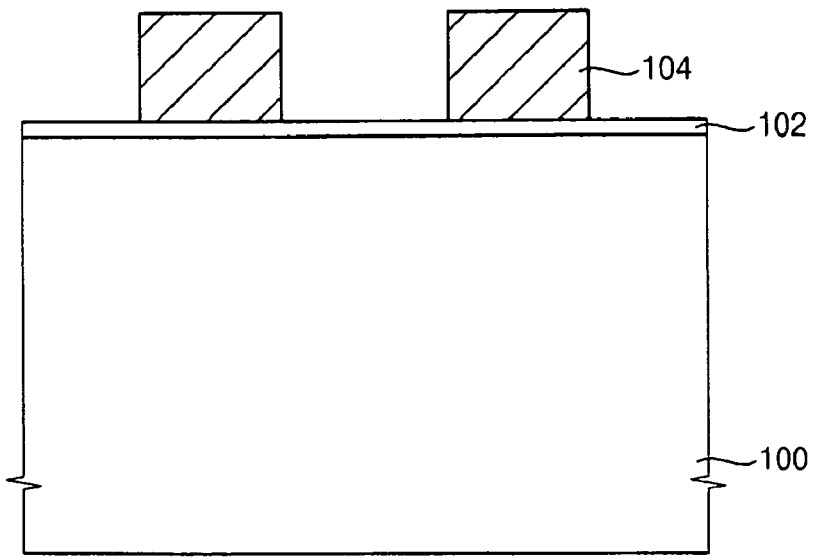

Referring to FIG. 3, a pad oxide layer 102 and a mask layer (not illustrated) may be sequentially formed on a substrate 100. The substrate 100 may include a semiconductor substrate or other similar substrates. For example, the substrate 100 may include a silicon substrate, a germanium substrate, a silicon-germanium substrate, an SOI substrate, a GOI substrate or the like.

The pad oxide layer 102 may be formed on the substrate 100 by a thermal oxidation process. When the substrate 100 includes silicon, the pad oxide layer 102 may include silicon oxide. The pad oxide layer 102 may have a desired thin thickness. The pad oxide layer 102 may reduce stress generated between the substrate 100 and the mask layer while forming the mask layer.

The mask layer may be formed using a material that has an etching selectivity relative to the pad oxide layer 102 and the substrate 100. For example, the mask layer may be formed using polysilicon, silicon nitride, silicon oxynitride or the like. The mask layer may be formed on the pad oxide layer 102 by a CVD process, a plasma enhanced chemical vapor deposition (PECVD) process, a low pressure chemical vapor deposition (LPCVD) process or the like.

Figure 10:
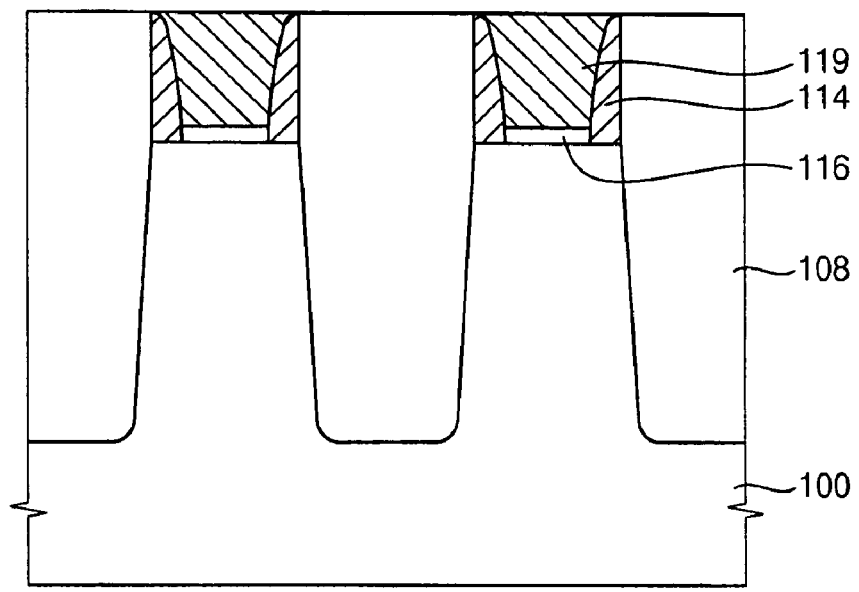

In example embodiments, the mask layer may have a thickness substantially the same as, or substantially higher, than a height of a floating gate 120 (see FIG. 10). For example, the mask layer may have a thickness of about 1,000 Å to about 2,000 Å based on an upper surface of the pad oxide layer 102.

A mask 104 may be formed on the pad oxide layer 102 by patterning the mask layer. The mask 104 may have a line shape extending along a first direction. Adjacent masks 104 may be substantially parallel to each other.

Figure 4:
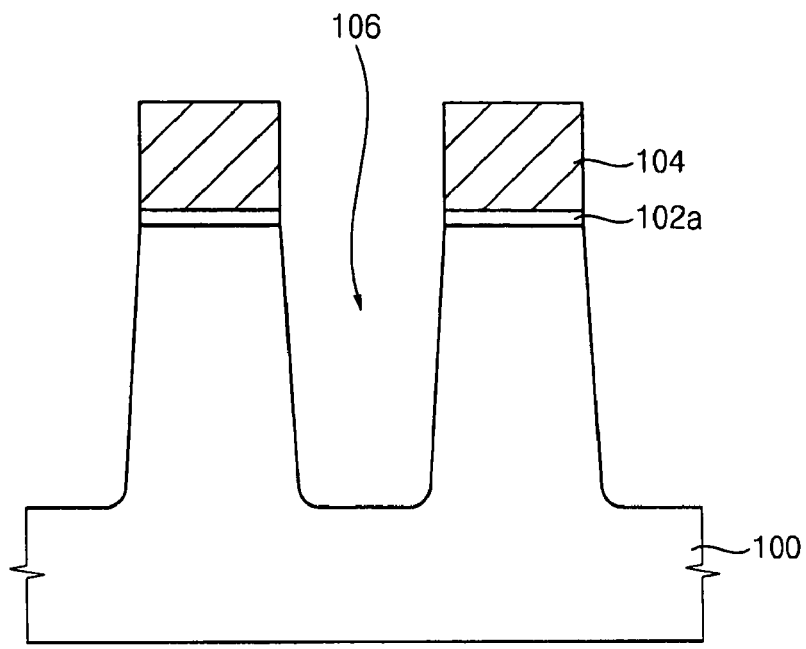

Referring to FIG. 4, a pad oxide layer pattern 102*a* may be formed on the substrate 100 by patterning the pad oxide layer 102 using the mask 104 as an etching mask. A portion of the substrate 100 exposed between adjacent masks 104 may be etched to form a trench 106 at an upper portion of the substrate 100. For example, the trench 106 may be formed by a dry etching process.

In example embodiments, the trench 106 may have a lower portion substantially narrower than an upper portion thereof. That is, the trench 106 may have a sidewall sloped by a desired angle. Because an isolation layer 108 (see FIG. 5) may fill up the trench 106, the isolation layer 108 may also have a sloped sidewall.

In example embodiments, an inner oxide layer (not illustrated) may be formed on an inside of the trench 106. The inner oxide layer may be formed by oxidizing the sidewall and a bottom of the trench 106. The inner oxide layer may be formed by a thermal oxidation process.

Figure 5:
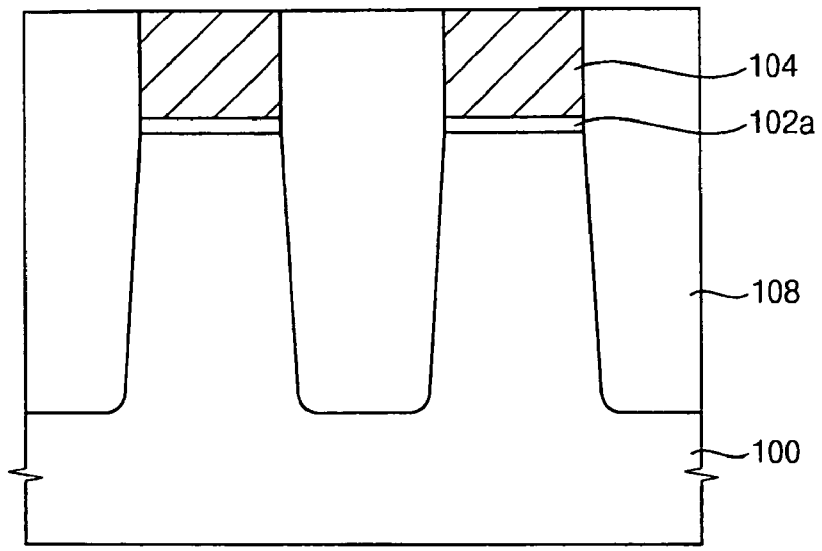

Referring to FIG. 5, an oxide layer (not illustrated) may be formed on the mask 104 to sufficiently fill up the trench 106. The oxide layer may have formed using an oxide that easily fills up a narrow gap. For example, the oxide layer may be formed using flowable oxide (FOX), undoped silicate glass (USG), spin on glass (SOG), high density plasma-chemical vapor deposition (HDP-CVD) oxide or the like. These may be used alone or in a mixture thereof.

The oxide layer may partially removed (or etched) until the mask 104 is exposed such that the isolation layer 108 is formed in the trench 104. The isolation layer 108 may be formed by a planarization process (e.g., a chemical mechanical polishing (CMP) process and/or an etch-back process). The isolation layer 108 may sufficiently fill up the trench 104 as described above.

Figure 6:
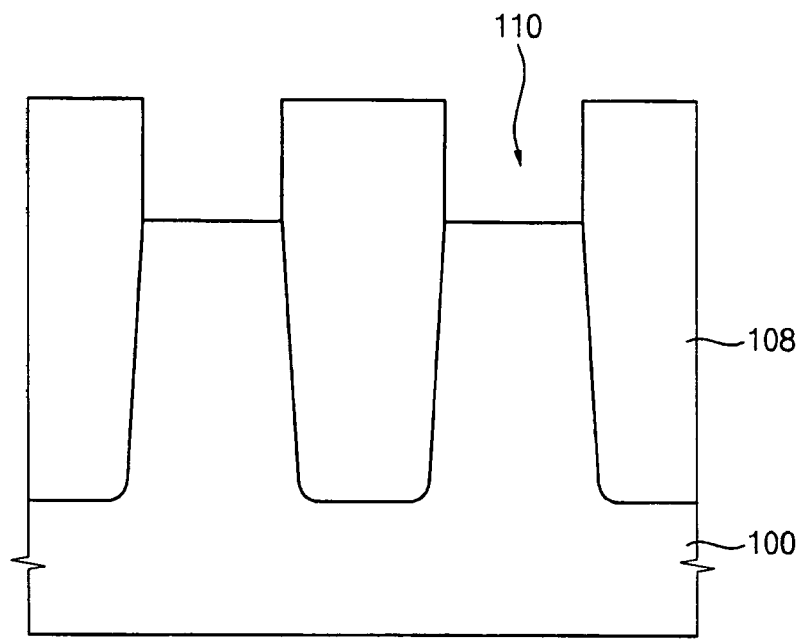

Referring to FIG. 6, the mask 104 and the pad oxide layer pattern 102*a* may be removed from the substrate 100. The mask 104 and the pad oxide layer pattern 102*a* may be removed by a wet etching process to prevent (or reduce) damage to the substrate 100 while removing the mask 104 and the pad oxide layer pattern 102*a*.

When the mask 104 and the pad oxide layer pattern 102*a* are removed, the isolation layer 108 may protrude from an upper surface of the substrate 100. The protruding portion of the isolation layer 108 may have a height substantially the same as, or substantially similar, to a total thickness of the mask 104 and the pad oxide layer pattern 102*a*. The isolation layer 108 may correspond to an isolation region (field region) of the semiconductor device. A portion of the substrate 100 exposed between adjacent isolation layers 108 may correspond to an active region of the semiconductor device. The isolation layer 108 may define the active and the field regions of the substrate 100. An opening 110 may be provided between adjacent isolation layers 108 after removing the mask 104 and the pad oxide layer pattern 102*a*.

Figure 7:
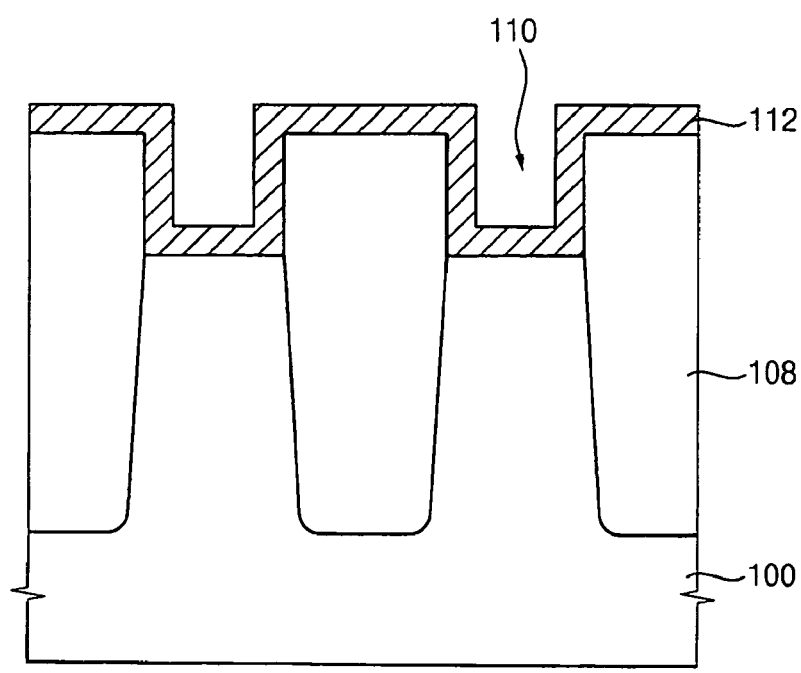

Referring to FIG. 7, an insulation layer 112 may be formed on the exposed portion of the substrate 110, a sidewall of the opening 110 and the isolation layer 108. The insulation layer 112 may be provided to form a spacer 114 (see FIG. 8) on a sidewall of the opening 110. The insulation layer 112 may be formed using a material that has an etching selectivity with respect to the isolation layer 108 and the substrate 100. For example, the insulation layer 112 may be formed using a nitride (e.g., silicon nitride) or an oxynitride (e.g., silicon oxynitride).

When the insulation layer 112 is formed on the sidewall of the opening 110, a width of the opening 110 may be reduced by a thickness of the insulation layer 112. Because a tunnel insulation layer 116 (see FIG. 9) and the floating gate 120 are successively formed in the opening 110, widths of the tunnel insulation layer 116 and the floating gate 120 may be controlled by adjusting the thickness of the insulation layer 112. The widths of the tunnel insulation layer 116 and the floating gate 120 may decrease when the insulation layer 112 is substantially thick. However, the widths of the tunnel insulation layer 116 and the floating gate 120 may decrease when the thickness of the insulation layer 112 decreases.

In example embodiments, an additional pad oxide layer may be formed on the exposed portion of the substrate 100 before forming the insulation layer 112. The pad oxide layer may be formed by a thermal oxidation process or a CVD process.

Figure 8:
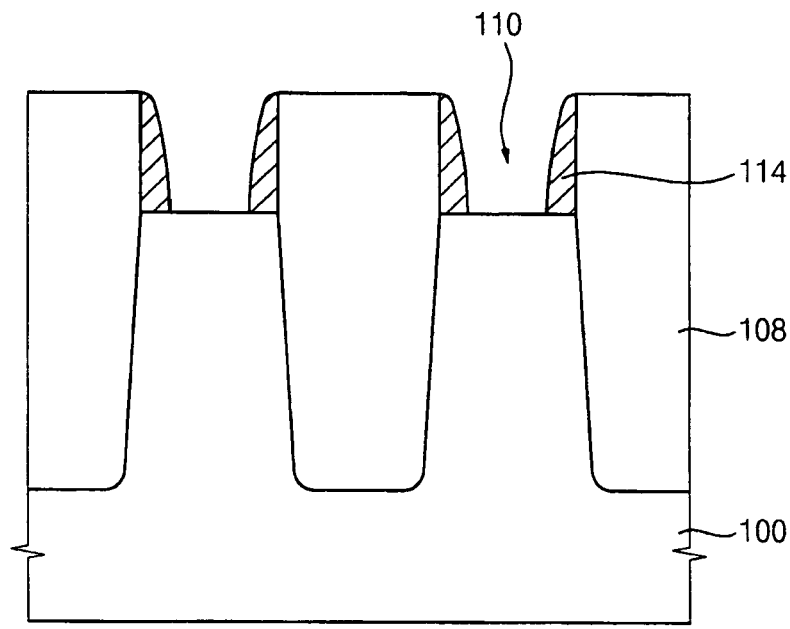

Referring to FIG. 8, the insulation layer 112 may be partially etched to form a spacer 114 on a sidewall of the protruding portion of the isolation layer 108. The spacer 114 may be formed on the sidewall of the opening 110. The insulation layer 112 may be etched by an anisotropic etching process.

In example embodiments, the spacer 114 may have a width that gradually decreases from the exposed portion of the substrate 100 towards the upper surface of the isolation layer 108. The spacer 114 may have an upper portion having a width substantially smaller than a width of a lower portion thereof. The opening 110 has an upper portion having a width substantially greater than a width of a lower portion in accordance with a structure of the spacer 114. The width of the lower portion of the opening 110 may be reduced by a lower width of the spacer 114.

Figure 9:
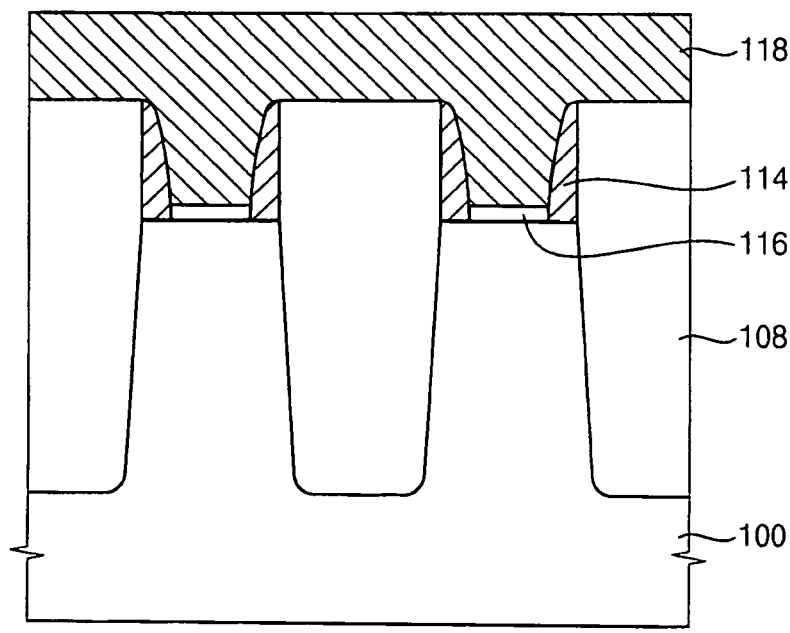

Referring to FIG. 9, the tunnel insulation layer 116 may be formed on the exposed portion of the substrate 100 between adjacent spacers 114. The tunnel insulation layer 116 may be formed by a thermal oxidation process or a CVD process. When the substrate 100 includes silicon, the tunnel oxide layer 116 may include silicon oxide. Because the spacers 114 are provided on sidewalls of the protruding portions of adjacent isolation layers 108, the tunnel insulation layer 116 may have a width reduced by the thickness of lower portions of both spacers 114. The width of the tunnel insulation layer 116 may be smaller than that of the active region of the substrate 100 defined by the isolation layer 108. When the width of the tunnel insulation layer 116 decreases, the capacitances at lateral portions of the tunnel insulation layer 116 may decrease to increase the coupling ratio of the semiconductor device.

A first conductive layer 118 may be formed on the tunnel insulation layer 116 and the isolation layer 108 to fill up the opening 110. The first conductive layer 118 may be formed using doped polysilicon, metal, metal compound or the like. The first conductive layer 118 may have a single layer structure or a multi-layer structure.

Referring to FIG. 10, the first conductive layer 118 may be partially removed until the isolation layer 108 is exposed. A preliminary floating gate 119 may be formed on the tunnel insulation layer 108 between adjacent spacers 114. The preliminary floating gate 119 may be formed by a CMP process and/or and etch-back process. The preliminary floating gate 119 may have a height substantially the same as the height of the protruding portion of the isolation layer 108. Upper surfaces of the preliminary floating gate 119 and the protruding portion of the isolation layer 108 may be positioned on the same plane.

Figure 11:
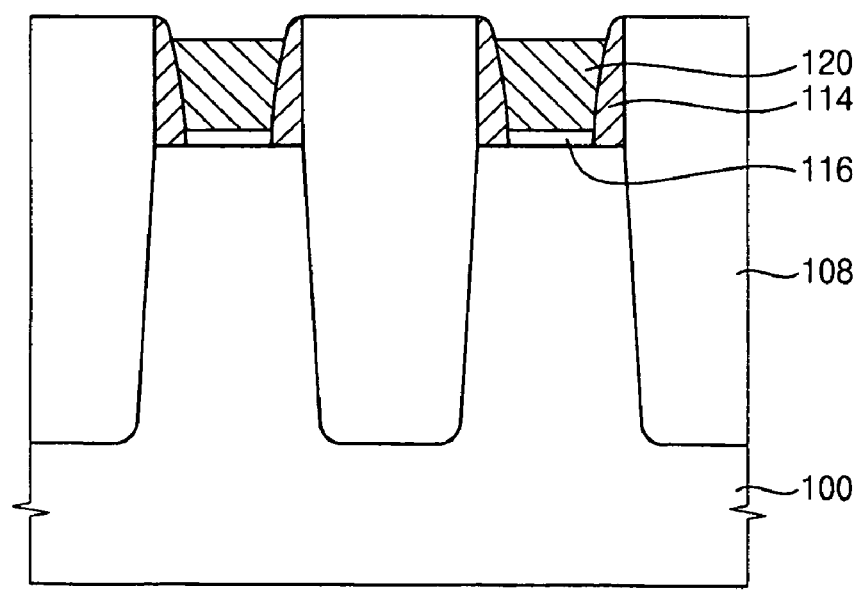

Referring to FIG. 11, the preliminary floating gate 119 may be partially etched to form the floating gate 120 on the tunnel oxide layer 108. Thus, the floating gate 120 may have a height substantially lower than the height of the protruding portion of the isolation layer 108. In other words, an upper portion of the floating gate 120 may be substantially lower than the upper surface of the protruding portion of the isolation layer 108. The floating gate 120 may be formed by a dry etching process or a wet etching process. Adjacent floating gates 120 may be separated by the protruding portion of the isolation layer 108 when the floating gate 120 has the height substantially smaller than the height of the protruding portion of the isolation layer 108.

In example embodiments, the first conductive layer 118 may be over-etched to form the floating gate 120 in the opening 110. The floating gate 120 may be directly formed on the tunnel oxide layer 116 without forming of the preliminary floating gate 119. As such, processes for manufacturing the semiconductor device may be simplified.

In example embodiments, the floating gate 120 may have a line shape extending along the first direction. Both lateral portions of the floating gate 120 may contact the sidewalls of the spacers 114. Hence, the width of the floating gate 120 may gradually increase from the lower portion towards the upper portion.

In example embodiment, the floating gate 120 may be formed by a self-alignment process using the spacers 114. The floating gate 120 may be self-aligned with respect to the spacers 114. Because an additional photolithography process for forming the floating gate 120 may not be required, failures related to the floating gate 120 that occur during the photolithography process may be reduced (or prevented) to increase electrical characteristics of the semiconductor device.

Figure 12:
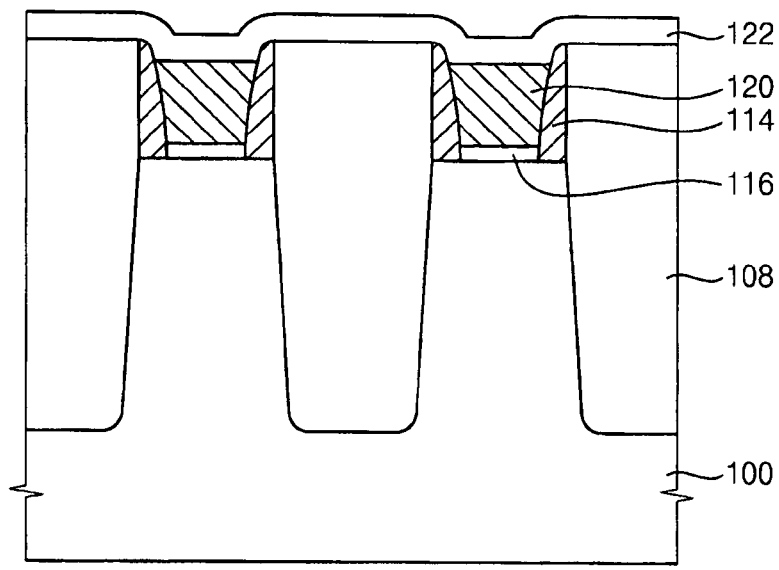

Referring to FIG. 12, a dielectric layer 122 may be formed on the floating gate 120 and the isolation layer 108. The dielectric layer 122 may be formed by an atomic layer deposition (ALD) process or a metal organic chemical vapor deposition (MOCVD) process. The dielectric layer 122 may be formed using a material having a dielectric constant substantially higher than that of silicon oxide. For example, the dielectric layer 122 may be formed using metal compound (e.g., hafnium oxide, tantalum oxide, zirconium oxide, aluminum oxide, yttrium oxide, vanadium oxide, hafnium aluminate, hafnium silicate and combinations thereof). These may be used alone or in a mixture thereof.

In example embodiments, the upper surface of the isolation layer 108 may be substantially the same as, or substantially higher, than the upper surface of the floating gate 120. That is, the isolation layer 108 may be positioned between adjacent floating gates 120. Interference between adjacent floating gates 120 may occur when a higher dielectric layer is interposed therebetween. Because the isolation layer 108 has a dielectric constant substantially lower than that of the dielectric layer 122, the interference between adjacent floating gates 120 may be prevented (or reduced).

In example embodiments, the floating gate 120 may have the upper portion substantially wider than the lower portion such that a contact area between the floating gate 120 and the dielectric layer 122 may increase. Thus, a capacitance of the dielectric layer 122 may increase, increasing a coupling ratio of the semiconductor device.

Figure 13:
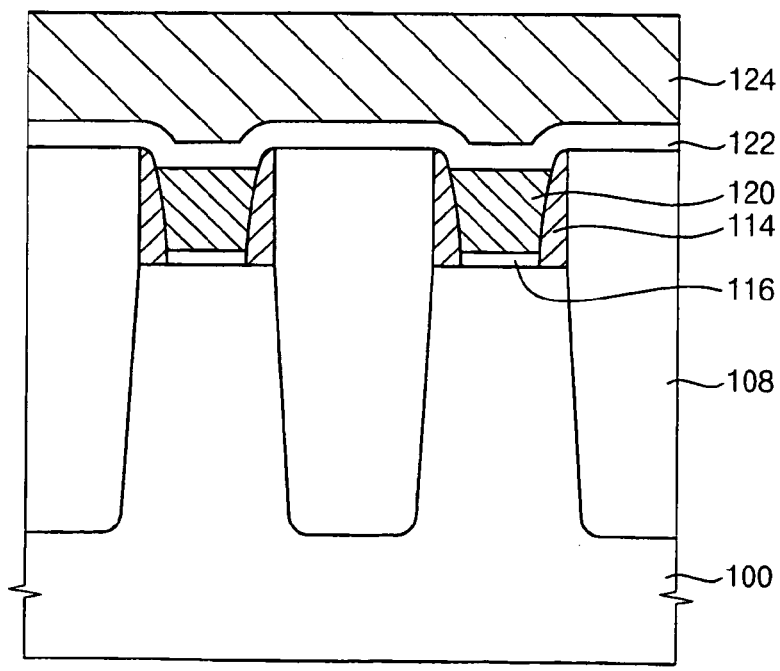

Referring to FIG. 13, a second conductive layer 124 may be formed on the dielectric layer 122. The second conductive layer 124 may be formed using doped polysilicon, a metal and/or a metal compound. The second conductive layer 124 may have a single layer structure or a multi-layer structure.

In example embodiments, the second conductive layer 124 may include a metal compound film and a polysilicon film successively formed on the dielectric layer 122. The metal compound film may be formed using a metal that has a work function above 4.5 eV. Examples of the metal in the metal compound film may include tantalum, tantalum nitride, titanium nitride and combinations thereof.

A mask (not illustrated) may be formed on the second conductive layer 124. The mask may have a line structure extending along a second direction substantially perpendicular to the first direction.

Using the mask as an etching mask, the second conductive layer 124 may be partially etched to form a control gate 124a on the dielectric layer 122. Thus, the control gate 124a may have a line shape extending in the second direction.

The dielectric layer 122 may be partially etched using the mask to form a dielectric layer pattern 122a on the floating gate 120. Because the floating gate 120 extends along the first direction, the dielectric layer pattern 122a may cross over the floating gate 120 as illustrated in FIG. 1. Each of the floating gates 120 on the substrate 100 may be isolated by the spacer 114 and the isolation layer 108. Each of the floating gates 120 on the substrate 100 may be arrange on the substrate 100 by a desired distance.

According to example embodiments, a dielectric layer pattern having a higher dielectric constant may not be interposed between adjacent floating gates such that interference between adjacent floating gates may be effectively prevented (or reduced). Hence, a semiconductor device including the floating gate and the dielectric layer pattern may have increased electrical characteristics. The floating gate may have an upper portion substantially wider than a lower portion thereof such that a capacitance between the floating gate and a tunnel insulation layer may decrease whereas a capacitance between the floating gate and the dielectric layer pattern may increase. Therefore, the semiconductor device may have an increased coupling ratio while more effectively reducing the interference between adjacent floating gates. Moreover, because the floating gate may be formed by a self-alignment process using a spacer without a photolithography process, floating gate failures caused during the photolithography process may be more efficiently prevented (or reduced).

The foregoing is illustrative of example embodiments and is not to be construed as limiting thereof. Although a few example embodiments have been described, those skilled in the art will readily appreciate that many modifications are possible in example embodiments without materially departing from the novel teachings and advantages. Accordingly, all such modifications are intended to be included within the scope of this invention as defined in the claims. In the claims, means-plus-function clauses are intended to cover the structures described herein as performing the recited function, and not only structural equivalents but also equivalent structures. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. A method of manufacturing a semiconductor device, comprising;
    forming an isolation layer protruding from a substrate;
    forming a spacer on a sidewall of a protruding portion of the isolation layer;
    forming a tunnel insulation layer on the substrate between adjacent isolation layers;
    forming a preliminary floating gate on the tunnel insulation layer such that a width of the preliminary floating gate gradually increases from a lower portion of the preliminary floating gate towards an upper portion of the preliminary floating gate and covering the spacer on the sidewall of the protrusion portion;
    forming a floating gate on the tunnel insulation layer by partially etching the preliminary floating gate, adjacent floating gates being separated from each other by the isolation layer;
    forming a dielectric layer pattern on the isolation layer and the floating gate; and
    forming a control gate on the dielectric layer pattern.

2. The method of claim 1, wherein forming the isolation layer comprises:
    forming a mask on the substrate;
    forming a trench by partially etching the substrate using the mask;
    forming an oxide layer on the mask to fill up the trench;
    partially removing the oxide layer until the mask is exposed; and
    removing the mask from the substrate.

3. The method of claim 1, wherein the isolation layer has a line shape extending along a first direction.

4. The method of claim 3, wherein the control gate has a line shape extending along a second direction substantially perpendicular to the first direction.

5. The method of claim 1, wherein a height of the protruding portion of the isolation layer is substantially larger than a height of the floating gate.

6. The method of claim 1, wherein forming the spacer comprises:
    forming an insulation layer on the isolation layer and the substrate; and
    anisotropically etching the insulation layer until the substrate is exposed.

7. The method of claim 6, wherein the insulation layer is formed using silicon nitride or silicon oxynitride.

8. The method of claim 1, wherein forming the preliminary floating gate comprises:
    forming a conductive layer on the tunnel insulation layer to fill up an opening between adjacent isolation layers; and
    partially removing the conductive layer until the isolation layer is exposed.

9. The method of claim 1, wherein the dielectric layer is formed using a material that has a dielectric constant substantially higher than a dielectric constant of silicon oxide.

10. The method of claim 9, wherein the dielectric layer is formed using at least one selected from the group consisting of hafnium oxide, tantalum oxide, zirconium oxide, aluminum oxide, yttrium oxide, vanadium oxide, hafnium aluminate, hafnium silicate and combinations thereof.

11. The method of claim 1, wherein the floating gate protrudes a first distance from the substrate and the isolation layer protrudes a second distance from the substrate such that the second distance is greater than the first distance.

12. The method of claim 1, wherein a height of the floating gate is substantially the same as a height of the protruding portion of the isolation layer.

13. The method of claim 1, a width of the spacer gradually decreases from the substrate towards an upper surface of the isolation layer.

* * * * *